(12) United States Patent
Patel

(10) Patent No.: US 6,759,864 B2
(45) Date of Patent: Jul. 6, 2004

(54) SYSTEM AND METHOD FOR TESTING INTEGRATED CIRCUITS BY TRANSIENT SIGNAL ANALYSIS

(75) Inventor: Chintan Patel, Reisterstown, MD (US)

(73) Assignee: Agilent Technologies, Inc., Palo Alto, CA (US)

(*) Notice: Subject to any disclaimer, the term of this patent is extended or adjusted under 35 U.S.C. 154(b) by 50 days.

(21) Appl. No.: 10/176,321

(22) Filed: Jun. 20, 2002

(65) Prior Publication Data

US 2003/0234658 A1 Dec. 25, 2003

(51) Int. Cl.[7] .............................................. G01R 31/26
(52) U.S. Cl. .................... 324/765; 324/73.1; 324/158.1
(58) Field of Search ................................ 324/73.1, 537, 324/763, 765, 158.1; 438/14, 17–18; 257/40–48; 714/724, 733–735

(56) References Cited

U.S. PATENT DOCUMENTS

| | | | | |
|---|---|---|---|---|
| 5,392,293 A | * | 2/1995 | Hsue .......................... 324/765 |
| 5,731,700 A | * | 3/1998 | McDonald ................ 324/158.1 |
| 6,031,386 A | | 2/2000 | Cole, Jr. et al. |
| 6,118,293 A | * | 9/2000 | Manhaeve et al. .......... 324/765 |
| 6,411,098 B1 | * | 6/2002 | Laletin ........................ 324/436 |

* cited by examiner

Primary Examiner—Minh N. Tang

(57) ABSTRACT

A system and method for testing an integrated circuit (IC) by transient signal analysis includes a comparison circuit that is configured to generate a comparison signal from an IC transient signal and a reference signal. Circuitry operationally coupled to the comparison circuit manipulates the comparison signal to generate a first output waveform area indicative of an absolute area of positive and negative portions within the comparison signal. The comparison circuit and the circuitry may include seven operational-amplifiers (op-amps) or ten op-amps. As a further processing sequence, a second output waveform area that is indicative of an absolute area of positive and negative portions within a second comparison signal is generated. In one embodiment, a first value representing the first waveform area and a second value representing the second waveform area are plotted to determine if the plotted X-Y coordinate falls within a predefined standard for determining the pass/fail status of the IC.

26 Claims, 16 Drawing Sheets

| DATA POINT | VARIATION | FIRST VALUE | SECOND VALUE |
|---|---|---|---|
| A | 5% INCREASE IN $\mu_0$ | .11 | .22 |
| B | 5% INCREASE IN $vt_0$ | .04 | .08 |
| C | 25% INCREASE IN $\mu_0$ | .43 | .70 |
| D | 25% INCREASE IN $vt_0$ | .24 | .47 |
| E | 10% DECREASE IN $\mu_0$ | .20 | .47 |
| F | 10% DECREASE IN $\mu_0$ | .11 | .16 |
| G | BRIDGING-DEFECT | .51 | .02 |

SYSTEM AND METHOD FOR TESTING INTEGRATED CIRCUITS BY TRANSIENT SIGNAL ANALYSIS

TECHNICAL FIELD

The invention relates generally to the testing of integrated circuits (ICs) and more particularly to a system and method for testing ICs by transient signal analysis.

BACKGROUND ART

Continuing increases in the complexity and density of integrated circuit (IC) components within a circuit chip have imposed an escalating challenge to the testing of circuitry. By one estimation, the cost of testing can contribute up to 20 percent of the total cost of manufacturing. To achieve economy of scales, it is critical that the cost of testing be minimized.

Minimizing cost in high-volume manufacturing requires that the testability of the IC be considered up front, since both time and money are required to achieve a desired level of quality. Various techniques for testing have existed for many years. In an IC production environment, quiescent power supply current ($I_{DDQ}$) testing has been used to detect defects in the ICs. However, the effectiveness of $I_{DDQ}$ testing in deep-submicron technologies (e.g., 0.13 $\mu$m processes) may be reduced due to high background currents, including sub-threshold leakage currents, and process drift variations.

The use of transient current or voltage testing techniques for the detection of defects addresses many problems associated with $I_{DDQ}$ testing. For one, transient current or voltage testing techniques are much less susceptible to variations induced by sub-threshold leakage currents. One such transient voltage testing technique is transient signal analysis (TSA). In a current TSA testing technique, an oscilloscope and digital signal processing (DSP) may be required. A concern associated with the use of an oscilloscope and DSP is that they add to the complexity, time and cost of manufacturing. Moreover, many transient current or voltage testing techniques do not account for process drift variations among the ICs. This is problematic, since a defect-free device-under-test (DUT) may be falsely rejected if it includes variations, such as transistor mobilities and threshold variations, that deviate from a defect-free reference IC, but which are within acceptable standards.

What is needed is a system and method for testing an IC by transient signal analysis, such that the complexity, time and cost of manufacturing, as well as false rejects due to process drift variations, are reduced.

SUMMARY OF THE INVENTION

A system and method for testing an integrated circuit (IC) by transient signal analysis includes a comparison circuit that is configured to generate a comparison signal from an IC transient signal and a reference signal. Typically, the comparison signal represents a difference between the IC transient signal and reference signal. The IC transient signal is specific to a monitored supply voltage to the IC. Circuitry operationally coupled to the comparison circuit manipulates the comparison signal to generate an output waveform for determining if the IC complies with a predetermined standard.

In a first embodiment, the system has a seven operational-amplifier (op-amp) configuration. At a first stage, a comparison circuit using two op-amps subtracts the IC transient signal from the reference signal to generate the comparison signal. At a second stage, an inverting amplifier inverts the comparison signal to generate an inverted signal. Optionally, the comparison signal is amplified by the inverting amplifier to generate an inverted amplified signal. The amplification provides an auxiliary gain to facilitate distinguishing variations within the signal. At a subsequent stage, a first rectifier in communication with the inverting amplifier receives the inverted amplified signal to output only first portions of the inverted amplified signal. The first portions may be the positive portions of the inverted amplified signal. The first rectifier is a single op-amp.

The inverted amplified signal generated by the inverting amplifier at the second stage is also received by a unity-gain inverter. The unity-gain inverter merely inverts the signal to generate a twice-inverted amplified signal. At the subsequent stage, a second rectifier receives the twice-inverted amplified signal to output only second portions of the twice-inverted amplified signal. Again, the second portions may be positive portions. The second rectifier is one op-amp and is in parallel with the first rectifier.

An adder-integrator circuit in communication with the first and second rectifiers adds the first portions of the inverted amplified signal and the second portions of the twice-inverted amplified signals and also identifies an output waveform area indicative of the first and second portions. The output waveform area is an absolute area of positive and negative portions within the output waveform. The adder-integrator is one op-amp.

In a second embodiment, the system has a ten op-amp configuration. At a first stage, a comparison circuit subtracts the IC transient signal from the reference signal to generate the comparison signal. The comparison signal is optionally amplified at a second stage to provide an auxiliary gain to further distinguish variations within the signal. If the optional amplification is not used, the second embodiment only includes nine op-amps. At a subsequent stage, a first rectifier in communication with the amplifier outputs first portions of the comparison signal. In one application, the first portions are positive portions of the comparison signal. The first rectifier includes two op-amps.

The comparison signal generated by the amplifier at the second stage is also received by a unity-gain inverter to invert the comparison signal. Subsequently, a second rectifier in communication with the unity-gain inverter outputs the second portions of the comparison signal. In one application, the second portions are positive portions of the comparison signal. The second rectifier includes two op-amps and is in parallel with the first rectifier.

A unity-gain adder receives and adds the first and second portions of the comparison signal. The unity-gain adder is one op-amp. An integrator in communication with the unity-gain adder identifies an output waveform area of the first and second portions. The output waveform area is an absolute area of positive and negative portions within the output waveform. The integrator is one op-amp.

As a further processing sequence, a second output waveform area is determined using the seven op-amp configuration or the ten op-amp configuration. The second output waveform area includes an absolute area of positive and negative portions within a second output waveform of a second comparison signal. The second comparison signal includes a difference between a second IC transient signal and a reference signal.

In one embodiment, the pass/fail status of the IC is established by applying statistical analysis. Accordingly, a correlator is provided to define a plot that is based on a first value corresponding to the output waveform area over a predefined time interval and a second value corresponding to the second output waveform area over an equivalent time interval. The X-Y coordinate that is defined by this pair is used to determine if the IC falls within a confidence level of a pass/fail standard.

An advantage of the invention is that the number of circuits needed for determining the pass/fail status of the IC is small, even in the ten op-amp configuration. This is potentially important, since it simplifies the hardware requirements needed for testing. Moreover, by using a small number of op-amps for determining the pass/fail status of the IC, the cost overhead in IC testing is reduced. Additionally, the use of statistical analysis to determine the pass/fail status of the IC is less susceptible to testing errors which might otherwise occur as a result of process drift variations among the ICs.

DETAILED DESCRIPTION

Within all of the embodiments of the invention, a system for integrated circuit (IC) testing by transient signal analysis includes a Supply Transient Integration Circuit (STIC). The STIC comprises a number of operational-amplifiers (op-amps) for processing two power transient signals that are received as inputs: a device-under-test (DUT) transient signal and a reference transient signal. The reference transient signal may be from a defect-free reference IC, a tester channel, or the same DUT.

Figure 1:
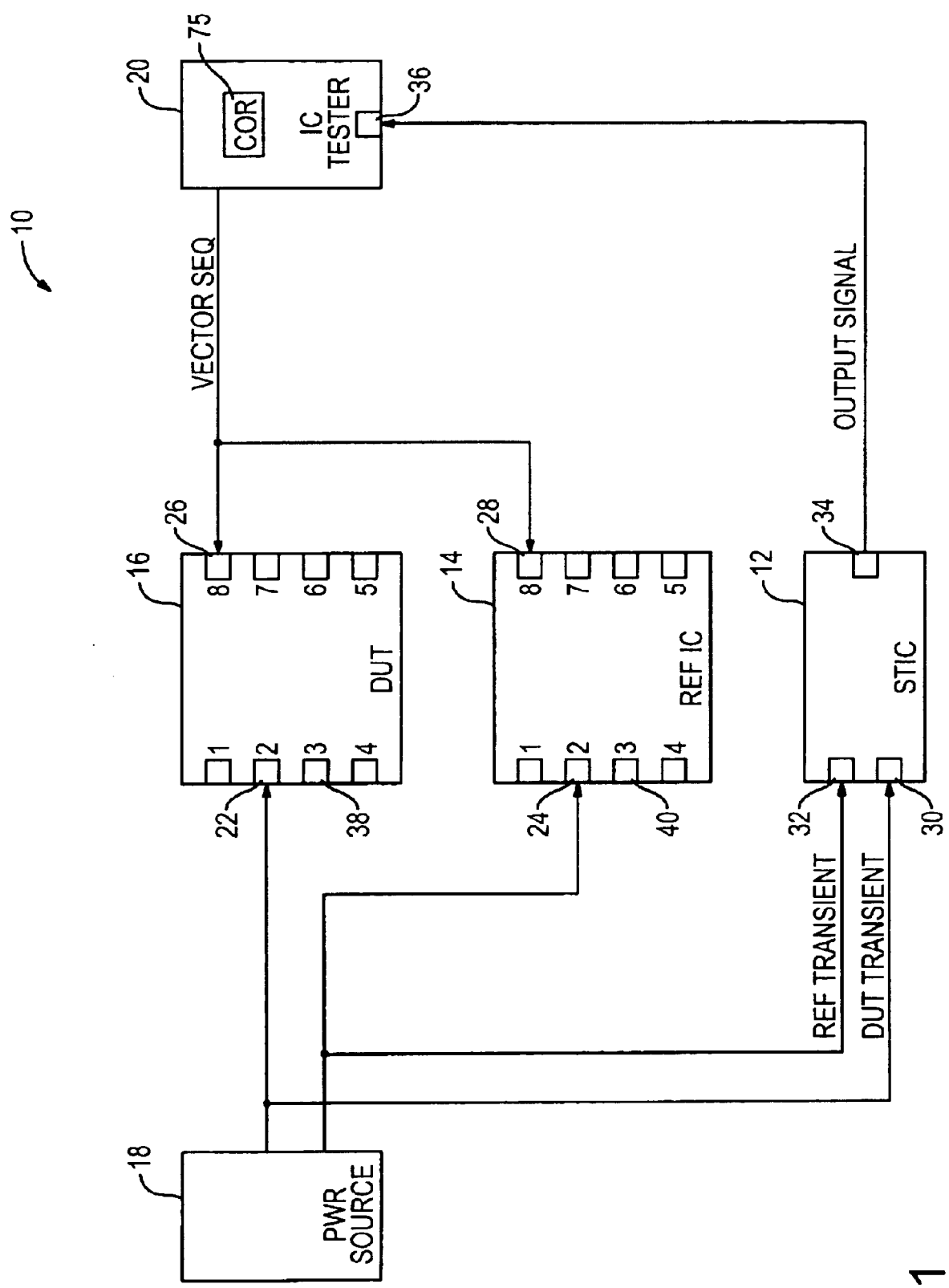
FIG. 1 is a system in which a reference transient signal that is received by the Supply Transient Integration Circuit (STIC) is provided by a defect-free reference integrated circuit (IC) in accordance with one embodiment of the invention.

As one embodiment of the invention, FIG. 1 shows a system 10 in which a STIC 12 is configured to receive a reference transient signal from a defect-free reference IC 14. The system also includes a DUT 16, a power source 18 and an IC tester 20. The power source provides an equal level of voltage to a supply terminal 22 of the DUT and to a corresponding supply terminal 24 of the reference IC (which is the same type of device as the DUT). The supply terminals 22 and 24 are corresponding supply pads (e.g., PIN NUMBER 2) of the devices. In one embodiment, the STIC is part of a probe card coupled to the DUT for testing in an IC production environment. In a different embodiment, the STIC is placed on a test-board.

In one processing sequence, the IC tester 20 provides an identical vector sequence of "high" and "low" voltage states to an input terminal 26 of the DUT 16 (e.g., PIN NUMBER 8) and to a corresponding input terminal 28 of the reference IC 14. In response to the switching between the "high" and "low" states, a transient signal characteristic of the DUT is monitored from the supply terminal 22 and a transient signal characteristic of the reference IC is monitored from the supply terminal 24. The DUT transient signal is received at an input terminal 30 of the STIC 12 and the reference IC transient signal is received at an input terminal 32. Subsequent processing by the STIC (which will be described in detail below) generates a first output signal that is indicative of a first output waveform area. The first output signal is transmitted from an output terminal 34 of the STIC to the IC tester.

A second output signal indicative of a second output waveform area is generated from a different set of power transient signals from corresponding supply pads of the DUT 16 and the reference IC 14. In an exemplary embodiment, the two power transient signals are monitored from the supply terminals 38 and 40 (e.g., PIN NUMBER 3) of the DUT and the reference IC, respectively. The second output signal is also transmitted to the IC tester. The first and second output signals are subsequently used to determine the pass/fail status of the DUT.

Figure 2:
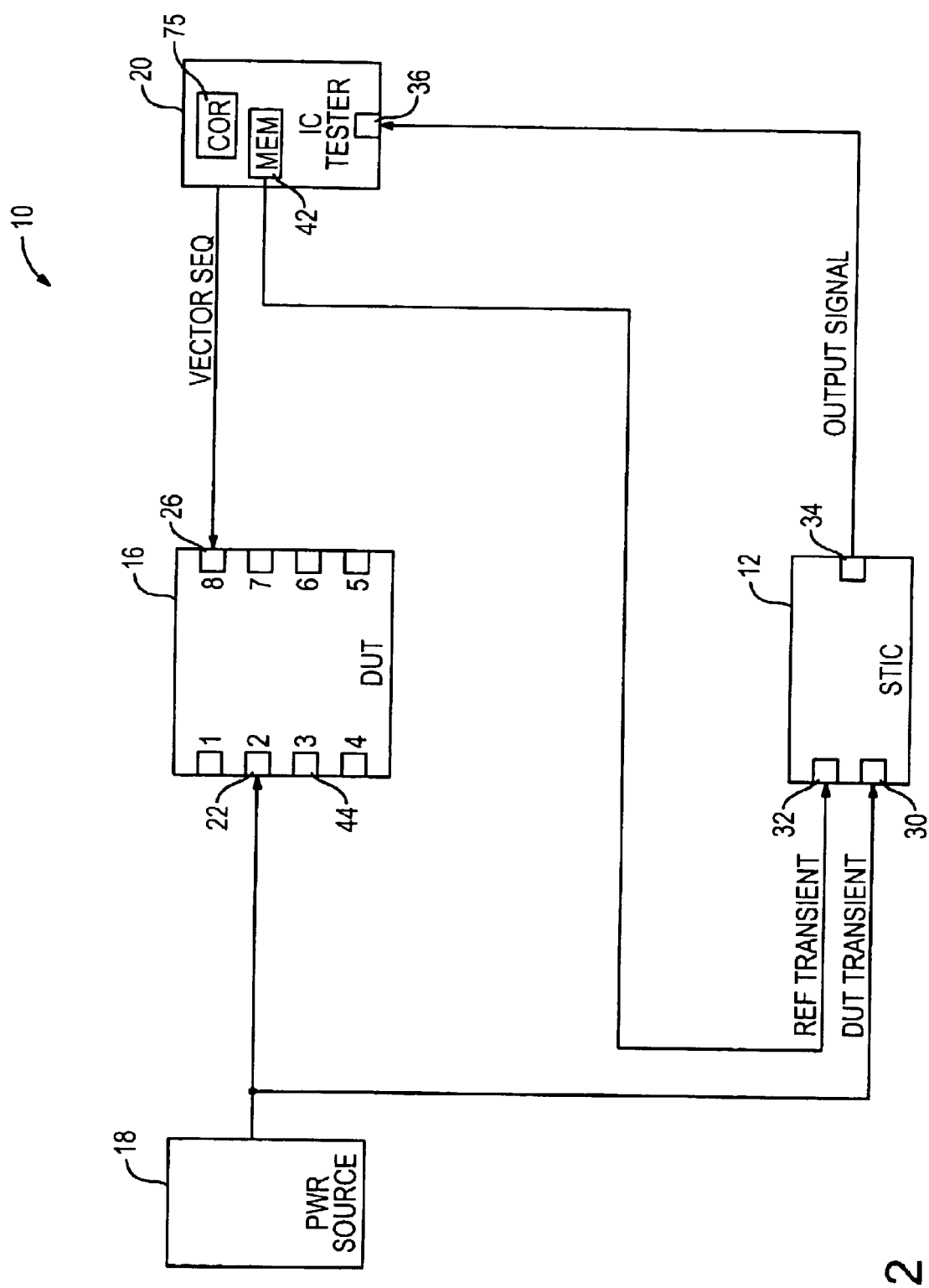
FIG. 2 is the system of FIG. 1 in which a reference transient signal that is received by the STIC is provided by a tester channel in accordance with a second embodiment of the invention.

In the embodiment of FIG. 2, the reference transient signal is provided by a tester channel. The reference transient signal is stored in memory 42 of the IC tester 20. As opposed to the embodiment of FIG. 1, a reference device (e.g., reference IC 14) is not physically required to generate the reference transient signal at each testing. Rather, the reference transient signal is stored in the tester memory and is available to the input terminal 32 of the STIC 12. Subsequent processing by the STIC (which will be described in detail below) of the DUT transient signal that is monitored from the supply terminal 22 (e.g., PIN NUMBER 2) of the DUT 16 and the reference transient signal generates a first output signal indicative of a first output waveform area. The first output signal is transmitted to the IC tester. Moreover, a second output signal indicative of a second output waveform area is generated from a different set of power transient signals, which may include the DUT transient signal that is acquired from a supply terminal 44 (e.g., PIN NUMBER 3) of the DUT and a corresponding reference transient signal that is stored in the tester memory. The first and second output signals are subsequently used to determine the pass/fail status of the DUT.

Figure 3:
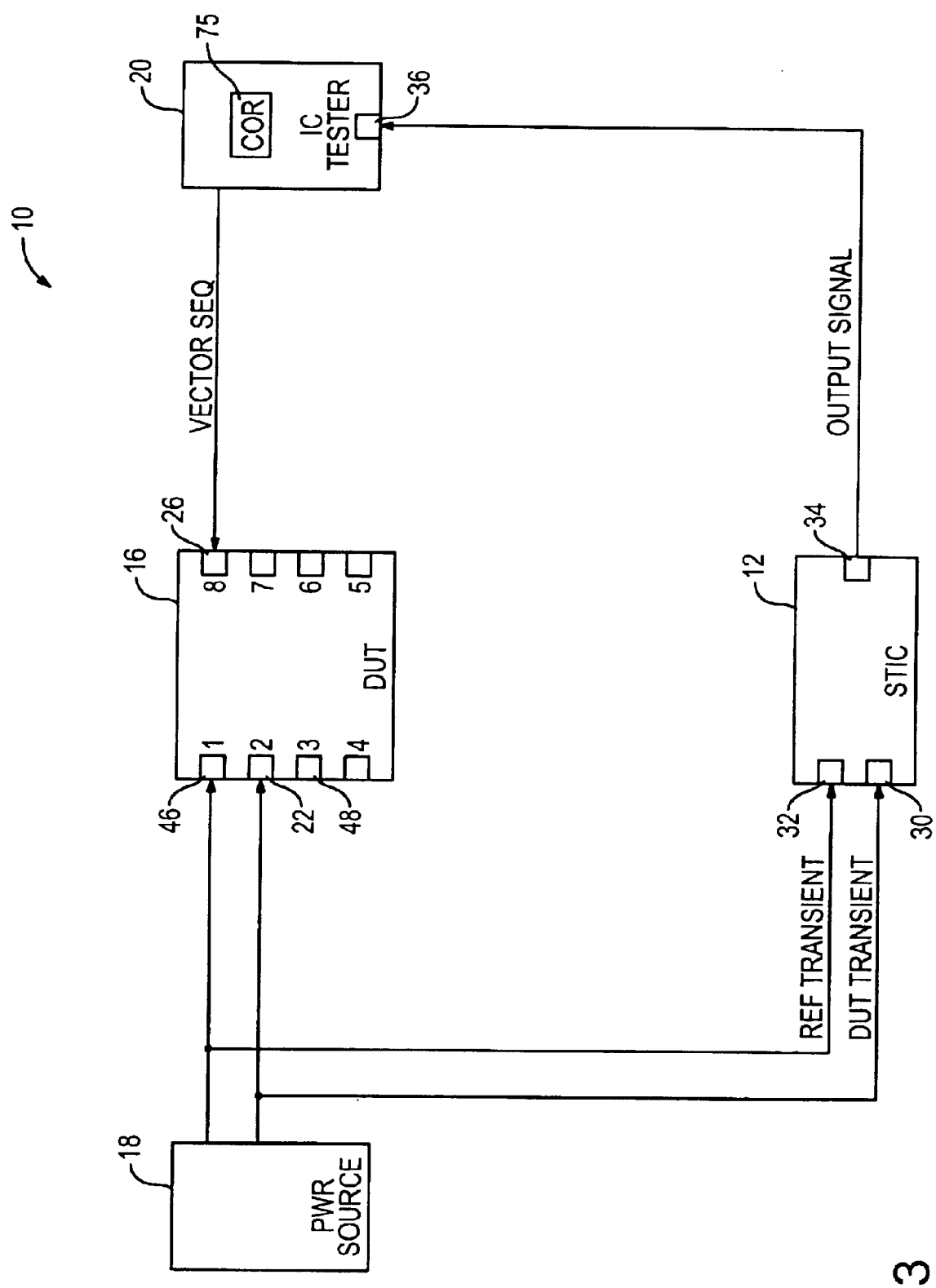
FIG. 3 is the system of FIG. 1 in which a reference transient signal that is received by the STIC is provided by a reference supply terminal from a device-under test (DUT) in accordance with a third embodiment of the invention.

As another embodiment, FIG. 3 shows the system 10 in which the reference transient signal is provided by a reference supply terminal 46 (e.g., PIN NUMBER 1) from the same DUT 16. The reference DUT transient signal at the supply terminal 46 is received by the STIC 12 via the input terminal 32 and the DUT transient signal from the supply terminal 22 (e.g., PIN NUMBER 2) is received via the input terminal 30. The reference DUT transient signal and the DUT transient signal are processed to generate a first output signal indicative of a first output waveform area. A second output signal indicative of a second output waveform area is generated from a different set of power transient signals, which may include the reference DUT transient signal from the supply terminal 46 and a different DUT transient signal from a supply terminal 48 (e.g., PIN NUMBER 3). The first and second output signals are subsequently used to determine the pass/fail status of the DUT.

The STIC 12 utilizes a number of high-frequency op-amps, so that the output signals generated by the STIC are compatible with a tester interface. The op-amps utilize high bandwidth and slew rate to sample the transient signals that have important frequency components at or below the DUT's operational frequency. In one embodiment, the STIC includes seven op-amps and in another embodiment, the STIC includes ten op-amps. While the invention will be described by the seven or ten op-amp embodiment, the STIC may include a different number of op-amps without diverging from the scope of the invention.

Figure 4:
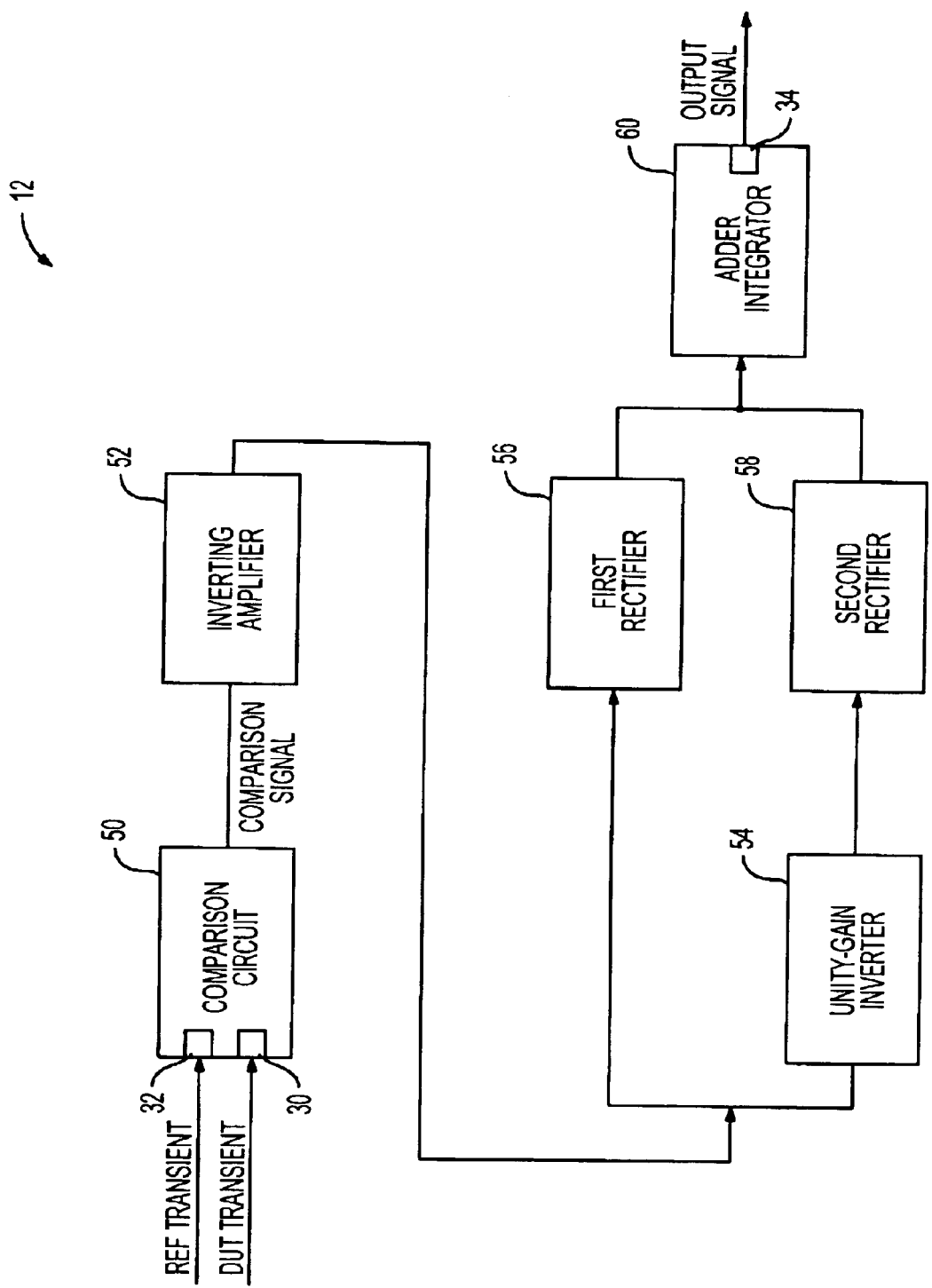
FIG. 4 is block diagram of the STIC of FIGS. 1, 2 or 3 having a seven op-amp configuration.

FIG. 4 shows a block diagram of the STIC 12 having seven op-amps. The STIC includes a comparison circuit 50 at a first stage. The monitored reference transient signal is received at the input terminal 32 of the comparison circuit and the monitored DUT transient signal is received at the input terminal 30 to generate a comparison signal. Circuitry operationally coupled to the comparison circuit manipulates the comparison signal. The circuitry includes an inverting amplifier 52, a unity-gain inverter 54, a first rectifier 56, a second rectifier 58, and an adder-integrator 60. The adder-integrator includes the output terminal 34 from which the first and second output signals corresponding to first and second output waveform areas are transmitted to the IC tester for subsequent analysis. In one embodiment, the comparison circuit, inverting amplifier, unity-gain inverter and adder-integrator operate using a +/−15V power supply, while the first and second rectifiers operate using a +/−5V power supply, or a +5V and a reduced negative (or 0V) supply.

Figure 5:
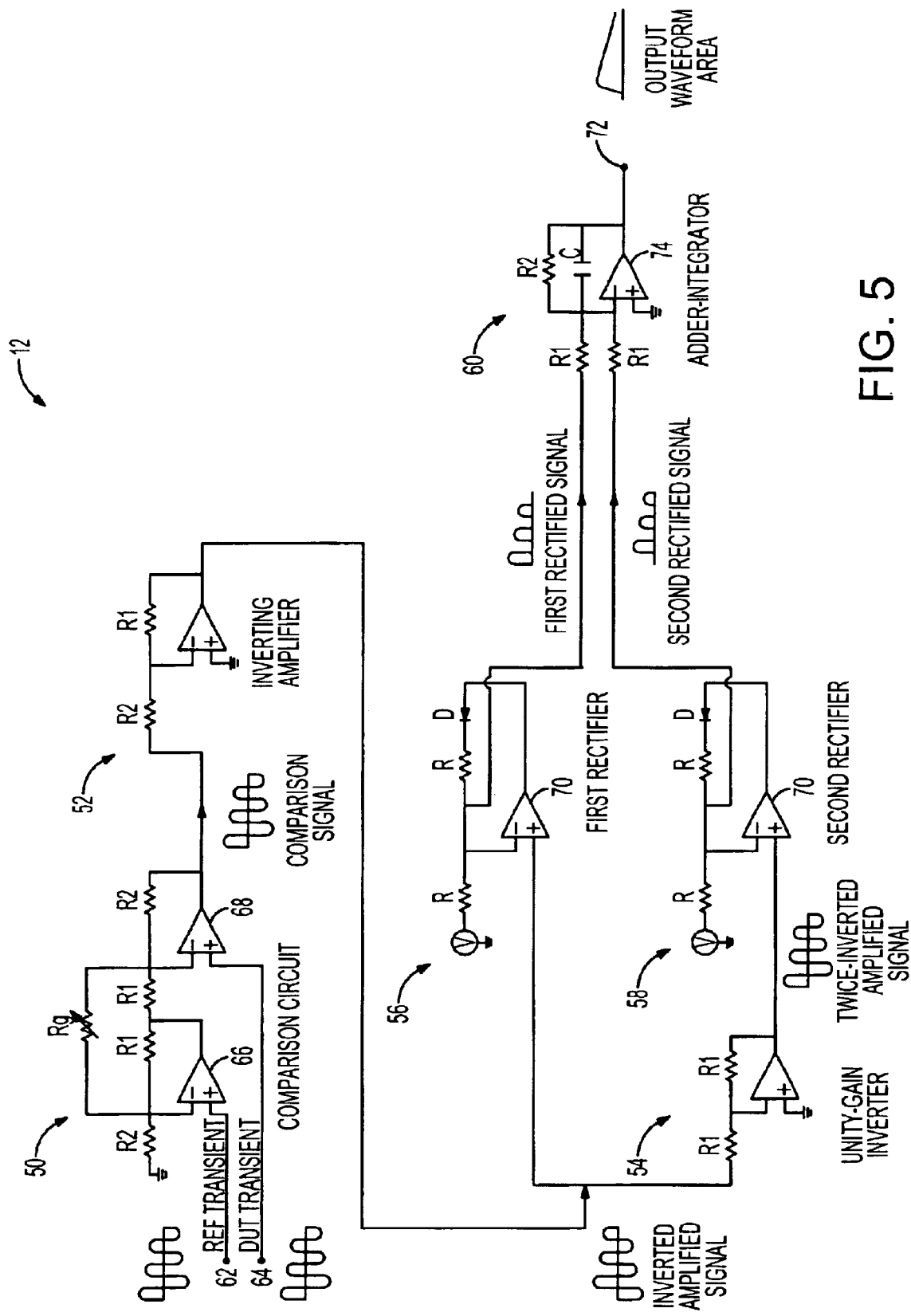
FIG. 5 is a circuit representation of the seven op-amp configuration of FIG. 4.
Figure 6:
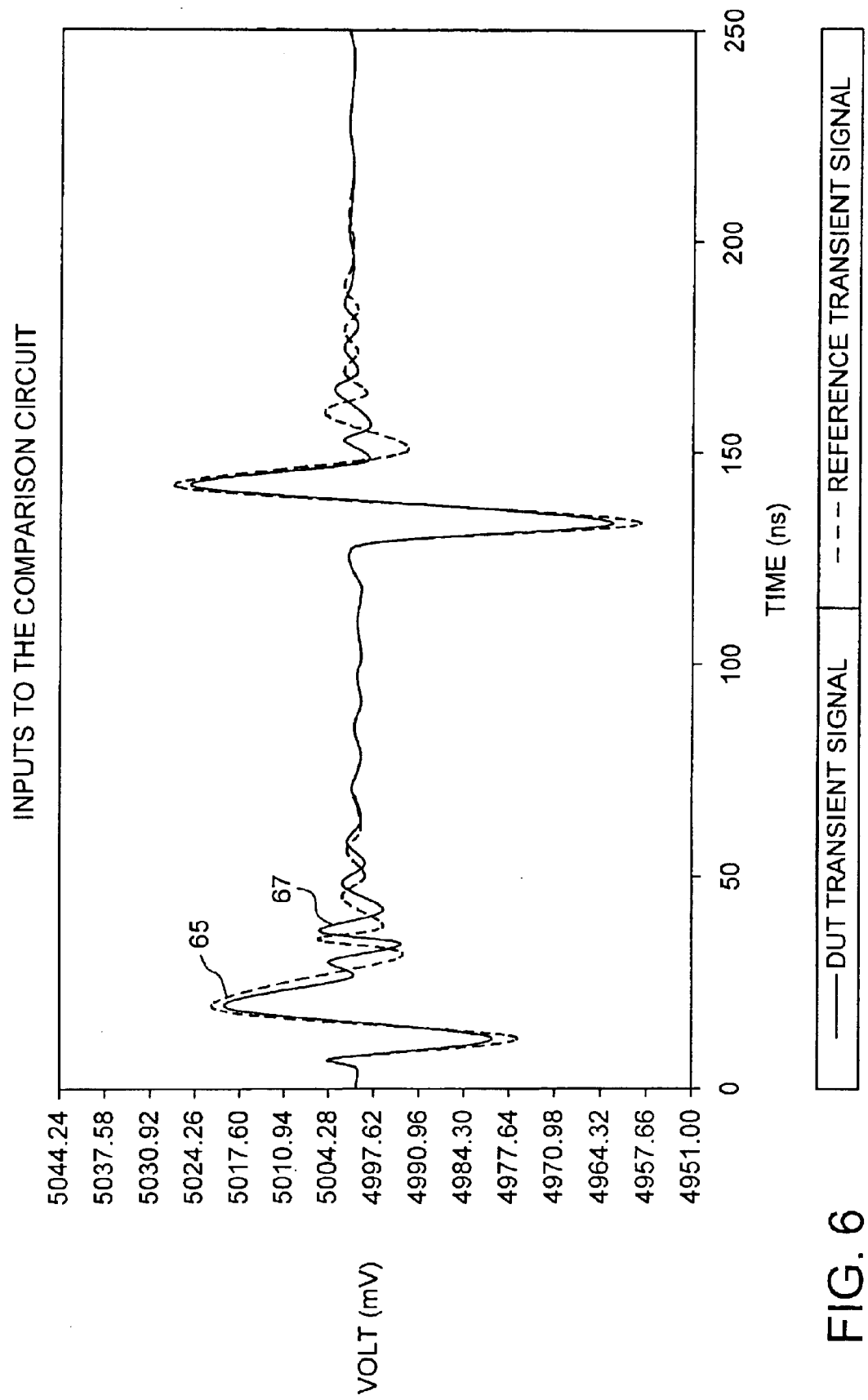
FIG. 6 is a SPICE simulation showing a reference transient signal and a DUT transient signal for the seven op-amp configuration of FIG. 4.

FIG. 5 shows a circuit representation of the seven op-amp configuration of FIG. 4. The comparison circuit 50 is at the first stage of the STIC 12 and includes two op-amps 66 and 68. The comparison circuit receives the reference transient signal at an input node 62 and the DUT transient signal at an input node 64. The input node 62 corresponds to the input terminal 32 of FIG. 4 and the input node 64 corresponds to the input terminal 30. FIG. 6 shows the two inputs (i.e., reference transient signal 65 and DUT transient signal 67) into the comparison circuit as simulated in SPICE. The reference transient signal is represented by a waveform having a dashed line and the DUT transient signal is represented by a waveform having a solid line. The horizontal axis is measured in nanoseconds (ns) and the vertical axis is measured in millivolts (mV).

Referring back to FIG. 5, the reference transient signal received at the input node 62 and the DUT transient signal received at the input node 64 are DC biased at the supply voltage. The comparison circuit 50 removes this bias and generates the comparison signal. In one embodiment, the comparison signal is generated by subtracting the DUT transient signal from the reference transient signal.

In operation, a first op-amp 66 of the comparison circuit 50 functions as a non-inverting amplifier for the reference transient signal. The output of the first op-amp drives a second op-amp 68, which inverts the signal received from the first op-amp. The circuit output tracks only the difference between the reference transient signal and the DUT transient signal (that is received at input node 64) to generate the comparison signal at the output.

A variable resistor Rg of the comparison circuit 50 is a gain control resistance. The adjustment of resistor Rg provides a tradeoff between the operational voltage range and the accuracy of the comparison signal. To ensure linearity, the total gain is set to approximately 10×. The voltage gain transfer relationship is given by:

$$\frac{E_0}{E_1} = -\left(1 + \frac{R2}{R1} + \frac{2R2}{Rg}\right)$$

where $E_0$ is the output voltage of the comparison circuit, and $E_1$ is the difference between the reference transient signal and the DUT transient signal.

The gain provided by the comparison circuit 50 allows an amplification of transient signals up to 100 mV, which is sufficient for processing in current DUT technologies using supply voltages in the range of 3.3V to 5V. The amplification may be adjusted by the variable resistor Rg to account for the small range of variations in the transient signals. The comparison circuit provides a high degree of accuracy over this voltage range at frequencies of up to 300 MHz. In a more demanding environment, the comparison circuit can be configured to operate at a speed of up to 600 MHz.

Since the STIC 12 comprises multiple op-amps arranged in successive stages, it is important that any error generated by the comparison circuit 50 be minimized, so that the error is not amplified in each of the successive stages to degrade the signal-to-noise ratio. Common mode rejection error of the two op-amps 66 and 68 of the comparison circuit is canceled, but other errors, including those caused by offset bias voltage and input bias current, may be inherent within the circuit.

Figure 7:
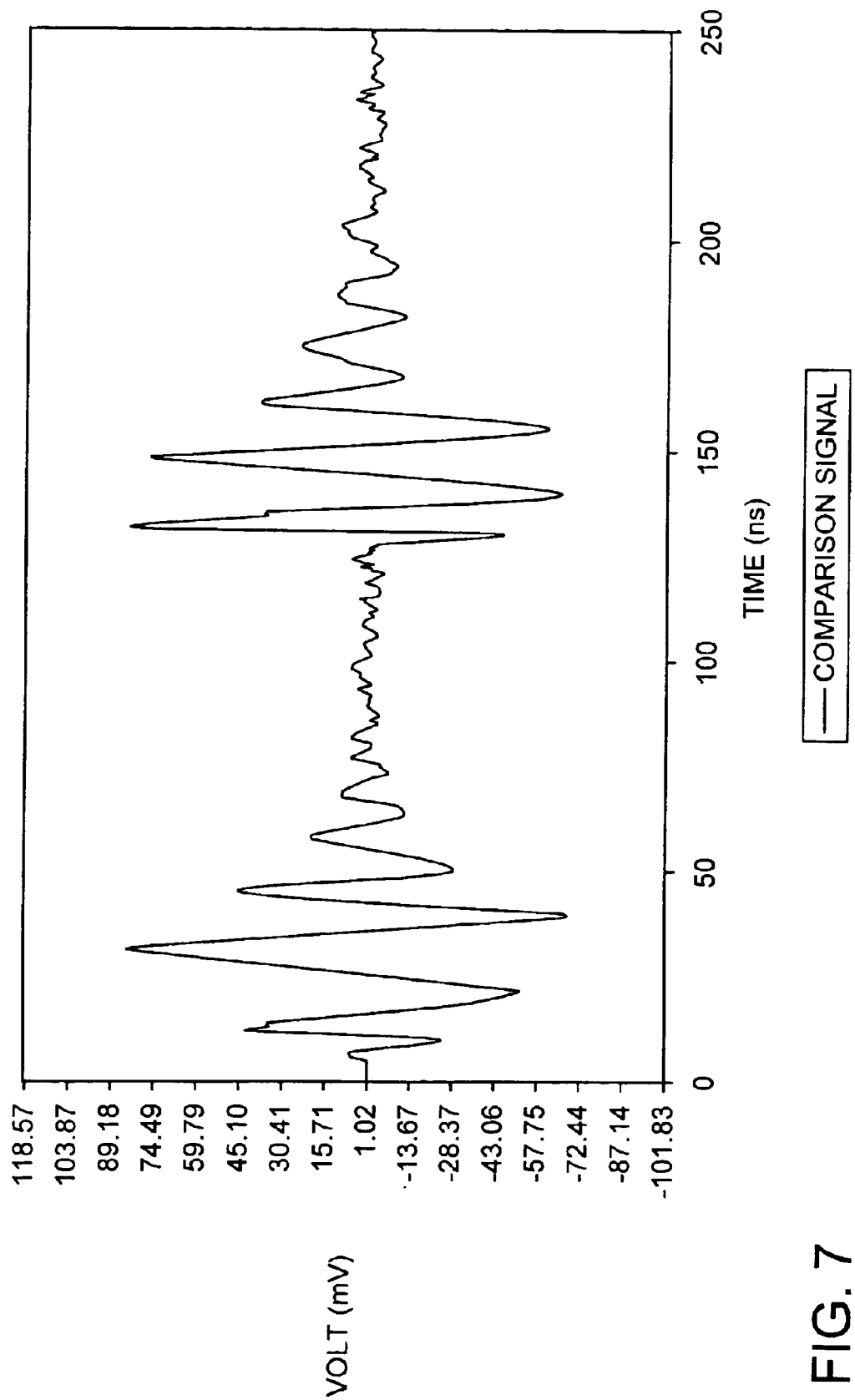
FIG. 7 is a SPICE simulation showing a comparison signal for the seven op-amp configuration of FIG. 4.

FIG. 7 is an example of a comparison signal represented by a waveform simulated in SPICE. The magnitude (i.e., level of voltage at the vertical axis) of the comparison signal is less than the magnitude of the reference transient signal 65 or the DUT transient signal 67 of FIG. 6, since the comparison signal represents the difference between the two transient signals.

Figure 8:
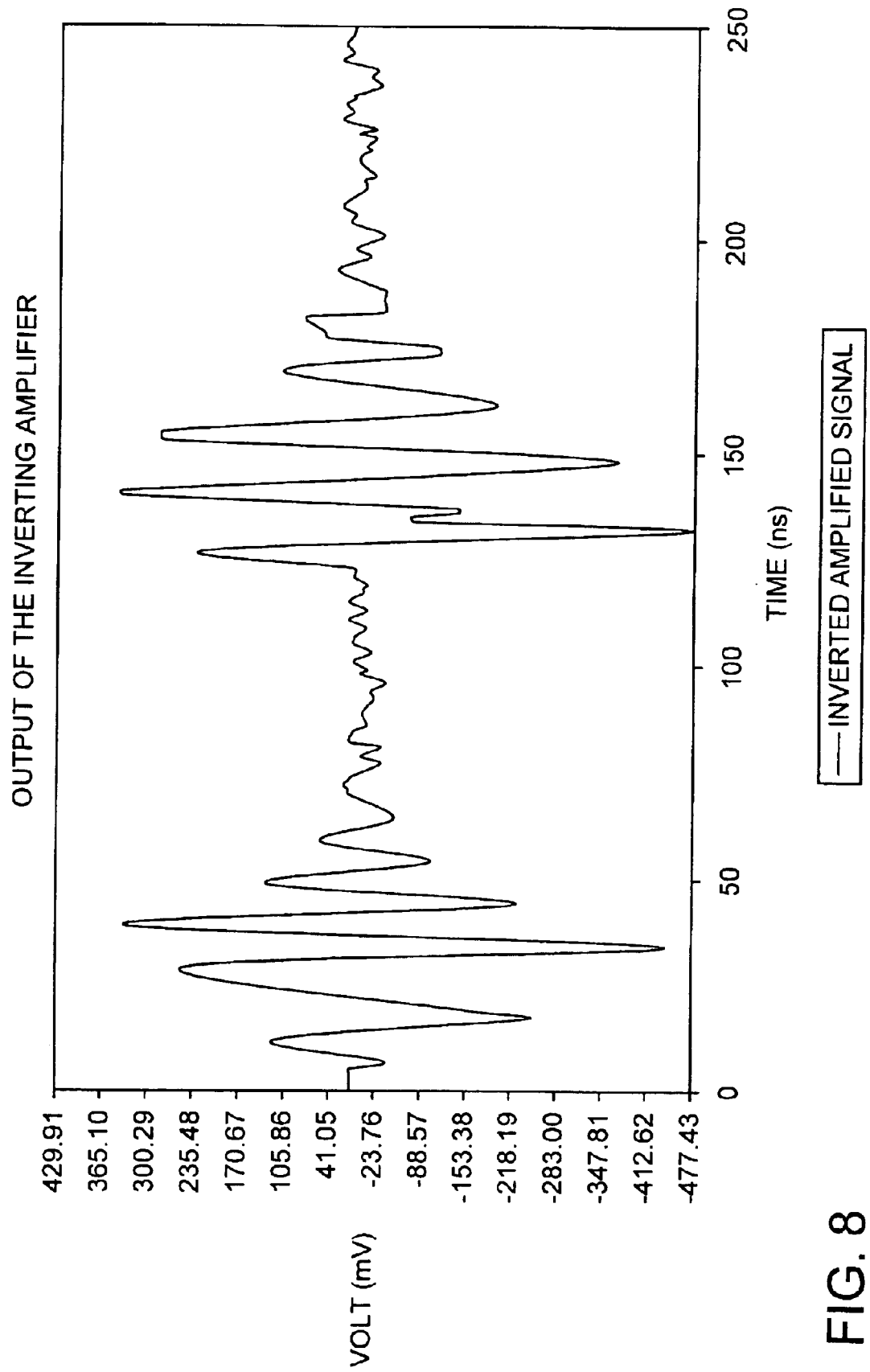
FIG. 8 is a SPICE simulation showing an inverted amplified signal for the seven op-amp configuration of FIG. 4.

Referring back to FIG. 5, at a second stage of the STIC 12 is the inverting amplifier 52 that is coupled to the comparison circuit 50. The inverting amplifier receives the comparison signal from the comparison circuit and inverts the signal to generate an inverted signal. The comparison signal is optionally amplified by the inverting amplifier to generate an inverted amplified signal. The amplification provides an auxiliary gain to distinguish variations within the comparison signal. FIG. 8 is an example of an inverted amplified signal represented by a waveform simulated in SPICE. The inverted amplified signal is inverted from the comparison signal of FIG. 7. The gain in magnitude of the inverted amplified signal as compared to the comparison signal is due to the amplification provided by the inverting amplifier.

The first rectifier 56 of FIG. 5 is coupled to the inverting amplifier 52. The first rectifier is a half-wave rectifier and receives the inverted amplified signal from the inverting amplifier and outputs a first rectified signal having only first portions of the inverted amplified signal. The first portions are positive portions of the inverted amplified signal.

A diode D in the negative-feedback path of an op-amp 70 in the first rectifier 56 functions as a rectifying component. Signal loss in the diode due to the gain of the op-amp is reduced. The input loading problem is addressed by connecting the inverted amplified signal directly to the non-inverting input terminal of the op-amp. In operation, when the voltage at the non-inverting input terminal of the op-amp is positive, the output voltage at the output terminal is also positive and the diode will conduct. This establishes a closed feedback path between the output terminal and the inverting input terminal. However, when the voltage at the non-inverting input terminal is negative, the output voltage at the output terminal is also negative. This will reverse-bias the diode and cause it to not conduct, resulting in the removal of the negative portions of the inverting amplified signal.

Figure 9:
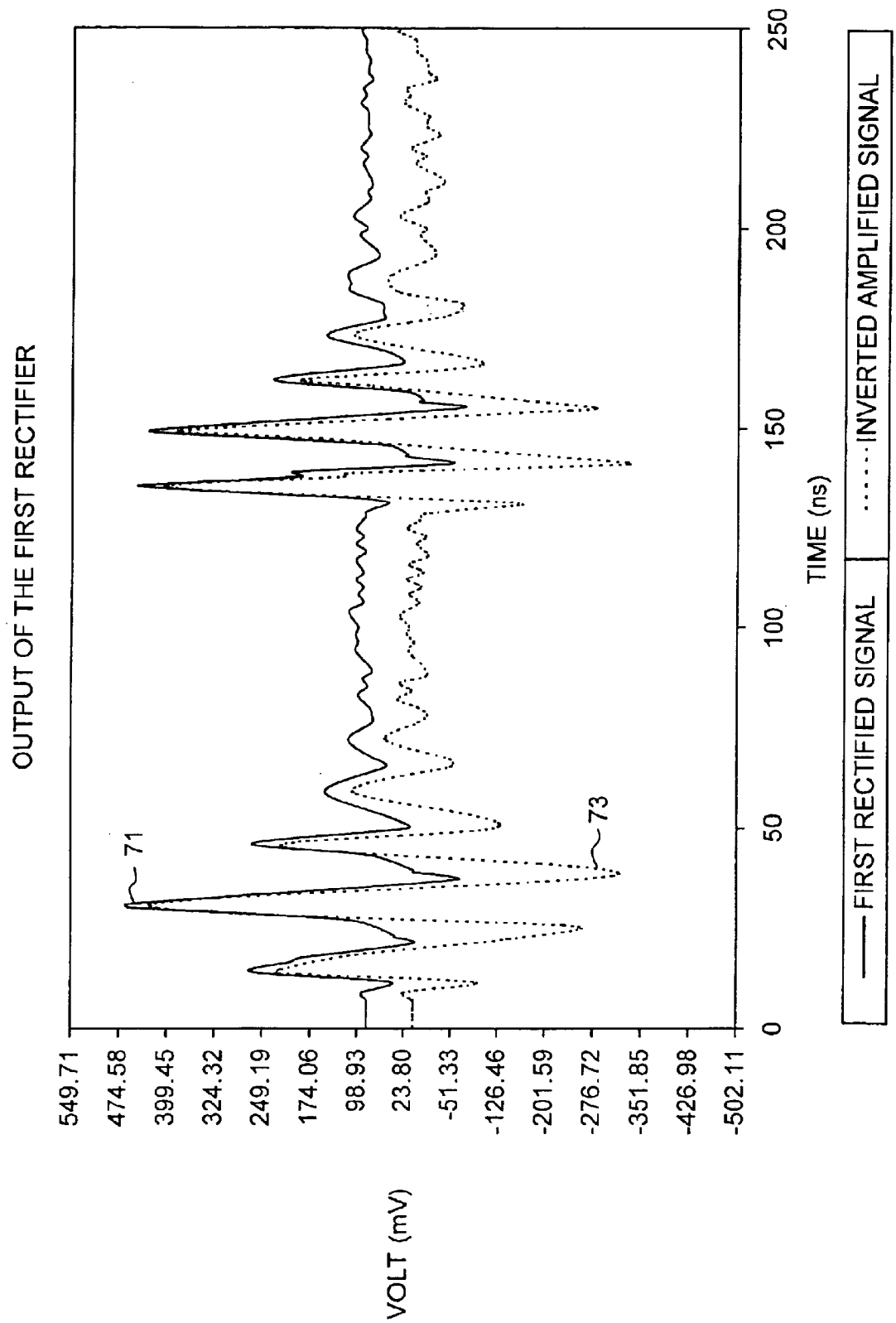
FIG. 9 is a SPICE simulation showing a first rectified signal in comparison with an inverted amplified signal for the seven op-amp configuration of FIG. 4.

FIG. 9 shows the first rectified signal 71 in comparison with the inverted amplified signal 73 as simulated in SPICE. The first rectified signal is represented by a waveform having a solid line and the inverted amplified signal is represented by a waveform having a dashed line.

Figure 10:
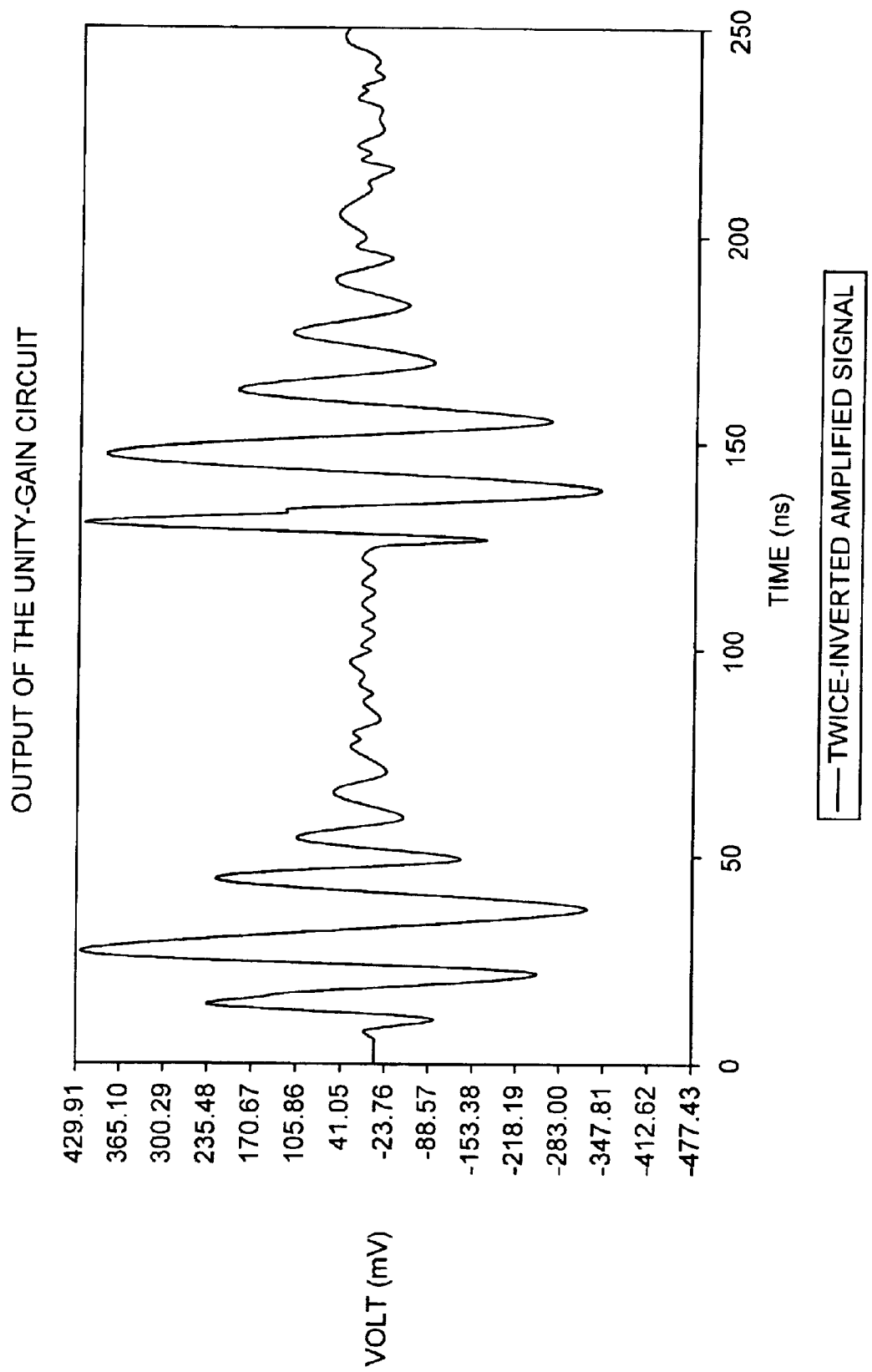
FIG. 10 is a SPICE simulation showing a twice-inverted amplified signal for the seven op-amp configuration of FIG. 4.

The inverted amplified signal generated by the inverting amplifier 52 of FIG. 5 is also received by the unity-gain inverter 54. Since the inverted amplified signal and its inverse are needed as inputs into the first and second rectifiers 56 and 58, the unity-gain inverter is used to merely invert the inverted amplified signal to generate a twice-inverted amplified signal. FIG. 10 shows an exemplary twice-inverted amplified signal in SPICE.

The second rectifier 58 of FIG. 5 is coupled to the unity-gain inverter 54. Similar to the first rectifier 56, the second rectifier is a half-wave rectifier. The second rectifier is in parallel with the first rectifier. The second rectifier receives the twice-inverted amplified signal from the unity-gain inverter and outputs a second rectified signal having only second portions of the twice-inverted amplified signal. The second portions are positive portions of the twice-inverted amplified signal.

While FIG. 5 includes the inverting amplifier 52, unity-gain inverter 54, and first and second rectifiers 56 and 58 for generating a pair of unipolar output signals (i.e., the first rectified signal having first positive portions and the second rectified signal having second positive portions) from a pair of bipolar signals (i.e., inverted amplified signal and twice-inverted amplified signal), other circuitry configurations can be used for generating the pair of unipolar output signals without diverging from the scope of the invention.

The adder-integrator 60 of FIG. 5 is coupled to the first and second rectifiers 56 and 58. The adder-integrator receives the first rectified signal and the second rectified signal and outputs a first output signal. The first output signal is indicative of the first output waveform area within the first and second rectified signals over a predefined interval. The first output waveform area also represents an absolute area of positive and negative portions within the comparison signal. In one embodiment, the predefined interval is 250 ns. The first output signal is transmitted from an output node 72 of the adder-integrator to the IC tester 20 (FIGS. 1, 2 and 3) for subsequent analysis. The output node corresponds to the output terminal 34 of the adder-integrator 60 in FIG. 4. In one embodiment, the first output signal is an analog signal.

The adder-integrator includes an op-amp 74. A capacitor C connected in a feedback path of the op-amp stores a voltage that is discharged when the input voltages of the first and second rectified signals fall to zero. The capacitor value is selected on the basis of a desired level of voltage that is to be stored in the capacitor and the cutoff frequencies of the circuit. The values of the resistors are selected on the basis of the cutoff frequencies of the circuit.

Figure 11:
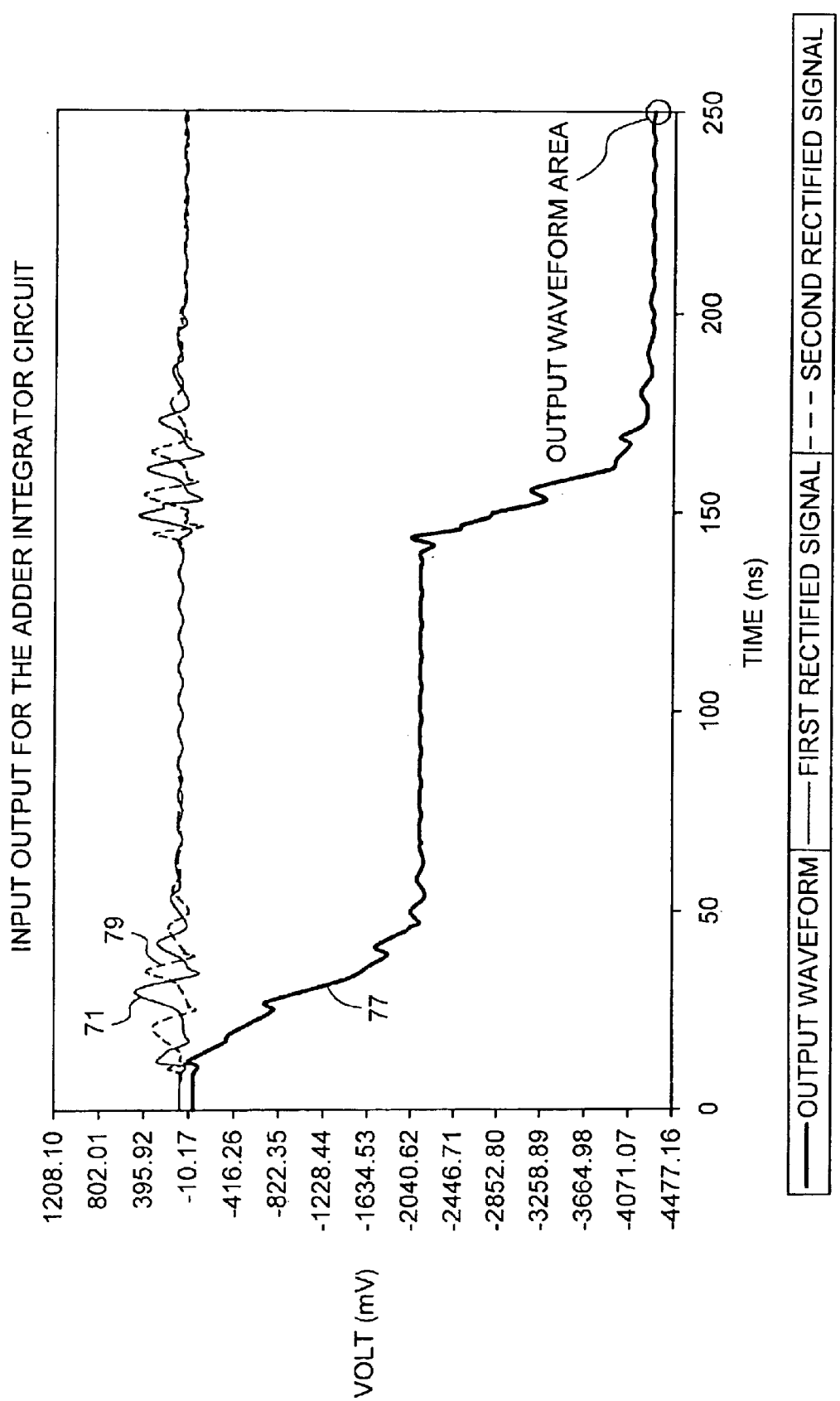
FIG. 11 is a SPICE simulation showing a first rectified signal and a second rectified signal along with an output waveform for the seven op-amp configuration of FIG. 4.

FIG. 11 shows the first and second rectified signals that are received by the adder-integrator and an output waveform relative to a zero baseline at 0V as simulated in SPICE. The first rectified signal 71 is represented by a waveform having a solid line. The second rectified signal 79 is represented by a waveform having a dashed line. The output waveform 77 is represented by a darkened solid line. The first and second rectified signals fall to the zero baseline from approximately 50 to 130 ns and from 190 to 250 ns. Between these time intervals, the capacitor discharges the stored voltage to hold the output waveform stable. The first output waveform area is a voltage value of the output waveform 77 taken at 250 ns.

As described earlier, a second output signal indicative of a second output waveform area is generated by the STIC 12 from a different set of power transient signals. The second output signal is also transmitted to the IC tester 20 for analysis. The second output waveform area includes an absolute area of positive and negative portions within a second comparison signal. The second output comparison signal may be generated by comparing a new DUT transient signal with a reference signal. The reference signal may be a new reference signal or the same reference signal that was used to generate the first output comparison signal.

As a further processing sequence, a cross-correlation is performed by a correlator 75 of the IC tester 20 (FIGS. 1, 2, or 3). The correlator may be a processor. In one embodiment, a first value corresponding to the first output signal and a second value corresponding to the second output signal are plotted by the correlator to determine if the plotted pairing falls within a confidence level. The confidence level is a defect-free device region and is delineated by $3\sigma$ confidence limits. That is, if the plotted first and second values fall within the confidence level, the DUT is statistically 99.9% defect-free. While the correlator is shown as being included within the IC tester, the correlator may be a separate device from the IC tester without diverging from the scope of the invention.

Figure 12:
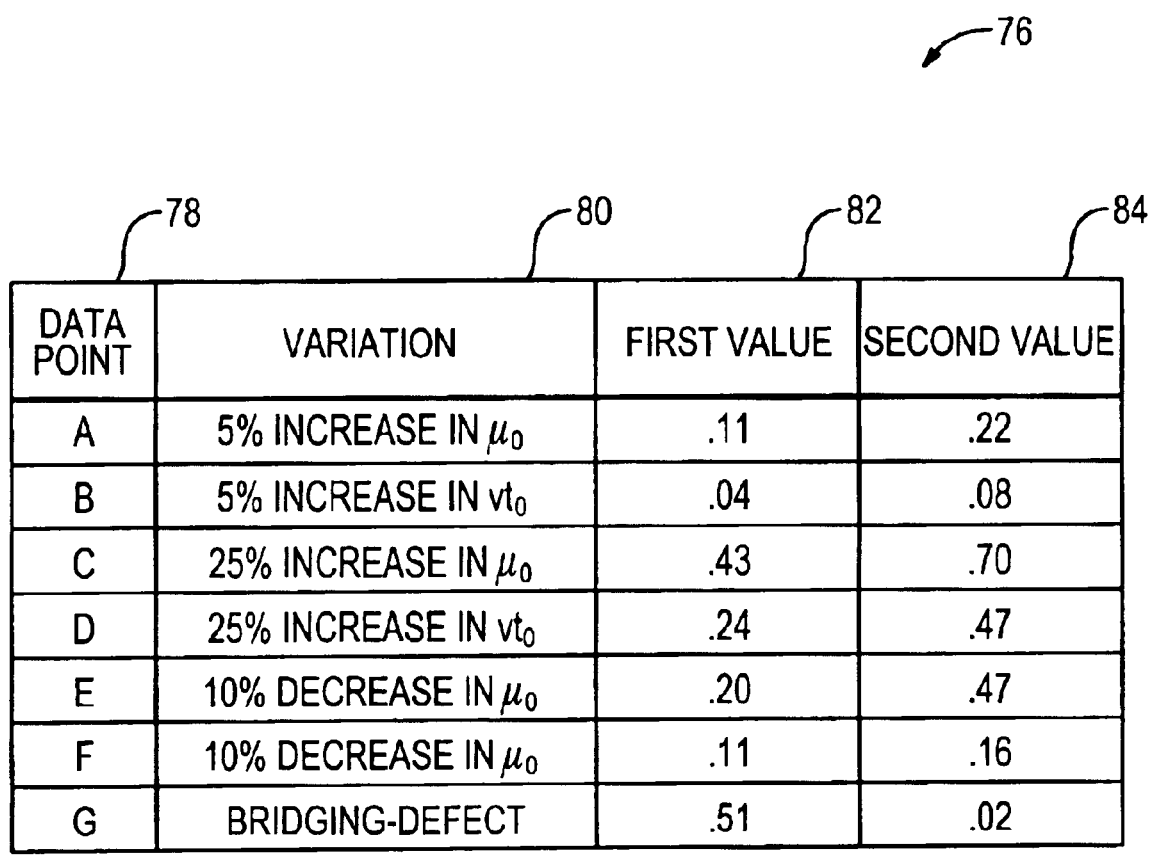
FIG. 12 is a table of a cross-correlation process of a simulated DUT in accordance with the invention.

FIG. 12 shows a table 76 of the cross-correlation process performed by the correlator 75. The cross-correlation process provides a means to determine the validity of a DUT, even if the DUT can be characterized by parameters that deviate from a defect-free IC. The cross-correlation process is exemplified by the table, which shows the results of seven simulation experiments, identified as data points A to G in column 78, in which parameters associated with the simulated DUT are varied. The possible variations, indicated by column 80, include global deviations by an indicated percentage of transistor mobilities ($\mu_0$) and threshold voltages (vt$_0$) from a nominal value of the DUT. The table also includes pairings of the first value that represents the first output signal indicative of the first output waveform area in column 82 and the second value that represents the second output signal indicative of the second output waveform area in column 84 for each simulation experiment A to G.

A correlation is found in the pairings of the first and second output waveform areas in the top six rows (i.e., data points A to F). That is, a ratio of the first and second values in one row is the same or about the same as a ratio of the first and second values in the other rows. For example, a ratio of 1:2 is determined from the first value of 0.11 and the second value of 0.22 in the first row. The same ratio is found from the first and second values of 0.04 and 0.08 in the second row. The correlation indicates that if a DUT deviates by the indicated variation in a production environment (e.g., 5% increase in $\mu_0$), the DUT will not be falsely rejected. Consequently, the cross-correlation process accounts for process drift variations among the devices.

In contrast, there is no correlation found in the last pairing (identified as data point G) with the pairings in the top six rows for a simulated DUT having a bridging-defect. The lack of correlation indicates that if a DUT includes a bridging-defect, the DUT will be properly rejected.

Figure 13:
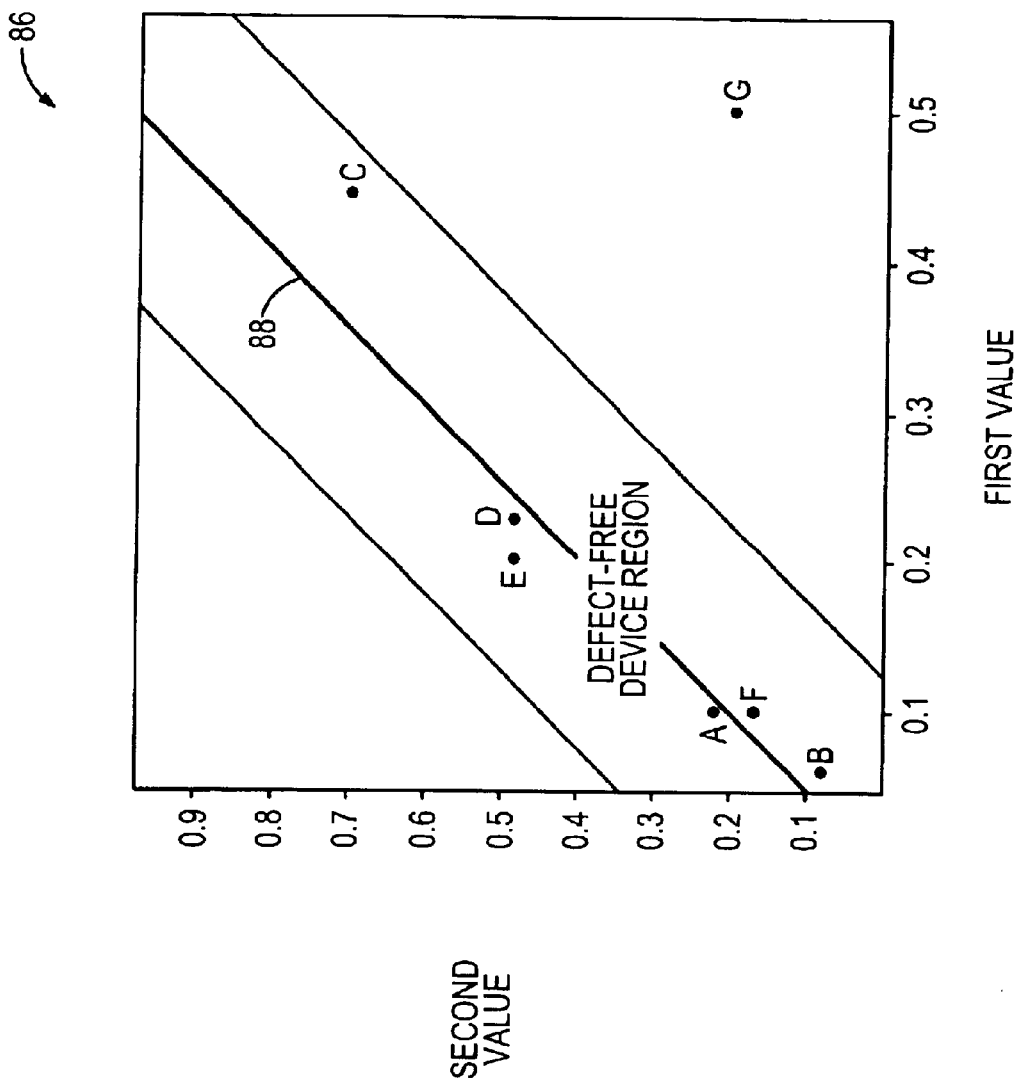
FIG. 13 is a graph showing a linear tracking of the first and second values corresponding to the simulated DUT of FIG. 12.

The pairings in the top six rows (i.e., data points A to F) may be used to derive the confidence level that defines the predetermined pass/fail standard, since a correlation is found in the pairings. FIG. 13 shows a graph 86 having a linear tracking of the pairings corresponding to data points A to F (FIG. 12). By regression analysis, the linear tracking generates a linear regression line 88. From the regression line, the confidence level can be determined. As described earlier, the confidence level is the defect-free device region, such that if the plotted first and second value pairs fall within the defect-free device region, the DUT is statistically 99.9% defect-free. The defect-free region also accounts for measurement noise and intra-device process variation effects. Moreover, FIG. 13 shows that data point G is outside of the defect-free region, as a result of the bridging-defect.

Figure 14:
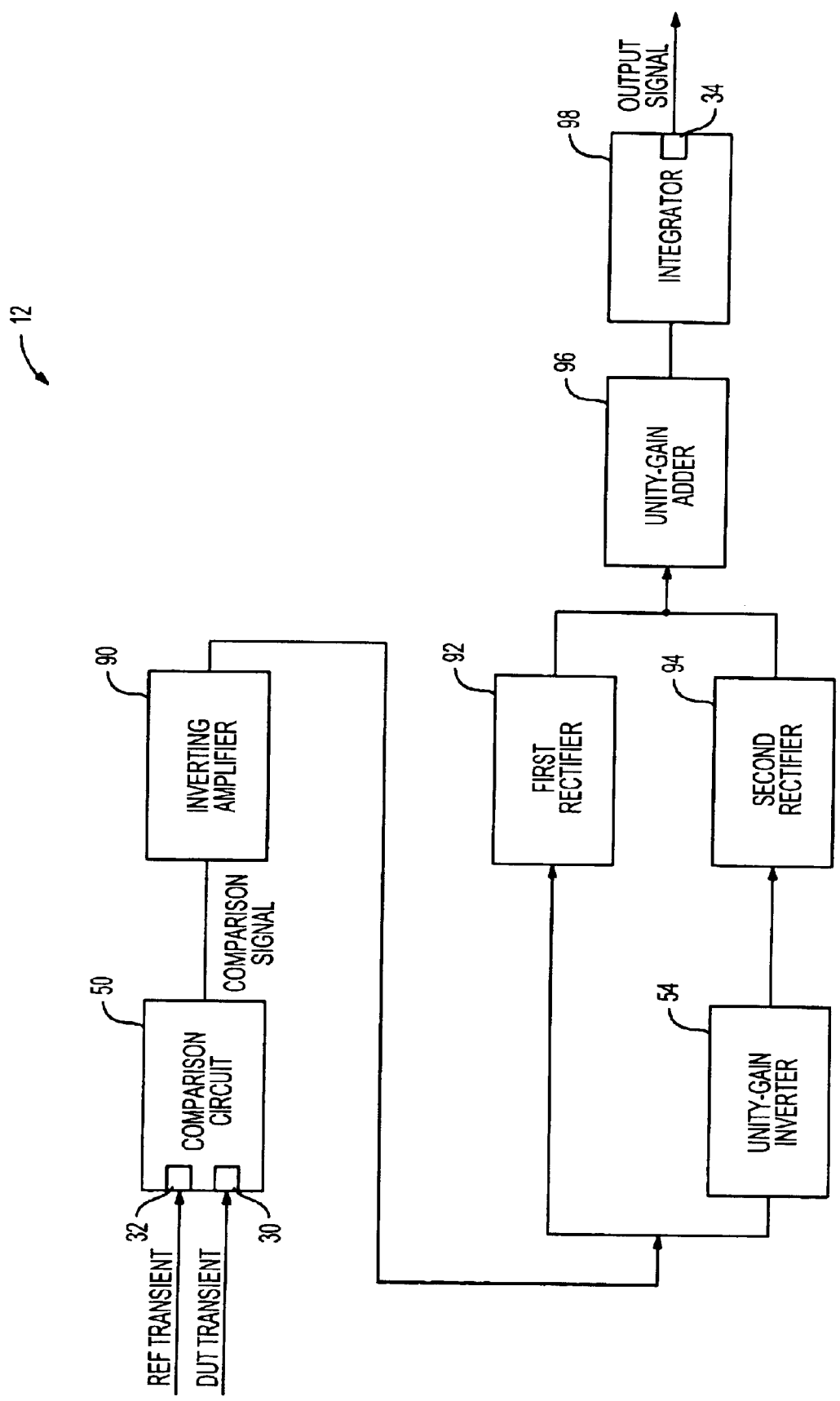
FIG. 14 is block diagram of a second embodiment of the STIC of FIGS. 1, 2 or 3 having a ten op-amp configuration.

In a second embodiment of the invention shown in FIG. 14, the STIC 12 is a ten op-amp configuration. The STIC includes the same type of comparison circuit 50 as in the seven op-amp configuration. The STIC receives the reference transient signal at the input terminal 32 and the DUT transient signal at the input terminal 30 and outputs the comparison signal. Circuitry operationally coupled to the comparison circuit manipulates the comparison signal. The circuitry includes an amplifier 90, the same type of unity-gain inverter 54 as the seven op-amp configuration, a first rectifier 92, a second rectifier 94, a unity-gain adder 96 and an integrator 98. The integrator includes the output terminal 34 from which the first and second output signals corresponding to first and second output waveform areas are transmitted from the circuit to the IC tester for subsequent analysis. In one embodiment, the comparison circuit, amplifier, unity-gain inverter, unity-gain adder and integrator operate using a +/-15V power supply, while the first and second rectifiers operate using a +/-5V power supply or a +5V supply with a reduced (or 0V) negative supply.

Figure 15:
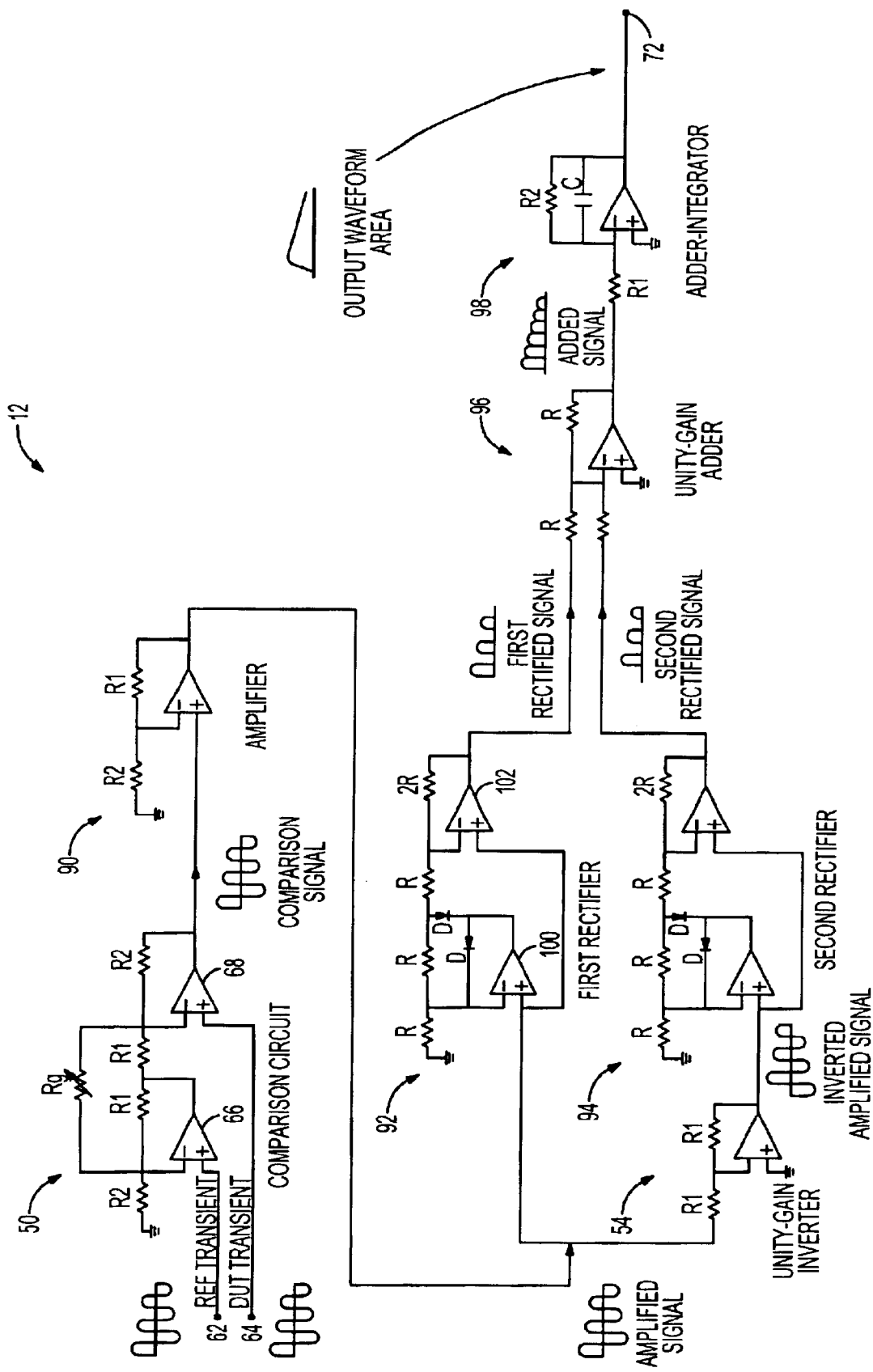
FIG. 15 is a circuit representation of the ten op-amp configuration of FIG. 14.

FIG. 15 shows a circuit representation of the ten op-amp configuration of FIG. 14. The comparison circuit 50 is at the first stage of the STIC 12 and includes two op-amps 66 and 68. The comparison circuit receives the reference transient signal at the input node 62 and the DUT transient signal at the input node 64. The input node 62 corresponds to the input terminal 32 and the input node 64 corresponds to the input terminal 30 of FIG. 14. The comparison circuit manipulates the two transient signals to generate the comparison signal. In one embodiment, the comparison circuit subtracts the DUT transient signal from the reference transient signal to generate the comparison signal.

At a second stage of the STIC 12, the comparison signal is optionally amplified by the amplifier 90 to generate an amplified signal. The amplifier receives the comparison signal to provide an auxiliary gain to further distinguish variations within the signal. If the optional amplification is not used, the second embodiment only includes nine op-amps.

At a subsequent stage, the first rectifier 92 is coupled to the amplifier 90. The first rectifier operates as a half-wave rectifier. The first rectifier receives the amplified signal from the amplifier to output a first rectified signal having only first portions of the amplified signal. Diodes are used as rectifying components and are connected in a negative-feedback path of an op-amp 100. Signal loss in the diodes due to the high gain of the op-amp is reduced. The input loading problem is addressed by connecting the amplified signal directly to the non-inverting terminal of the op-amp. The first rectifier is sensitive to resistor mismatch, which can cause a gain error when the gain obtained for the positive cycle is different from the gain obtained for the negative cycle. By connecting the input from the previous stage to the non-inverting terminals of both op-amps 100 and 102, the output of the first rectifier is the first rectified signal having only first portions of the amplified signal. Here, the first portions are positive portions of the amplified signal.

The amplified signal generated by the amplifier 90 at the second stage is also received by the same type of unity-gain inverter 54 as in the seven op-amp configuration. The unity-gain inverter merely inverts the amplified signal to generate an inverted amplified signal.

The second rectifier 94 is coupled to the unity-gain inverter 54. Similar to the first rectifier 92, the second rectifier operates as a half-wave rectifier. The second rectifier is in parallel with the first rectifier. The second rectifier receives the inverted amplified signal from the unity-gain inverter and outputs a second rectified signal having only second portions of the inverted amplified signal. Again, the second portions are positive portions of the inverted amplified signal.

In a different arrangement (not shown), a single rectifier may be used in place of the first and second rectifiers 92 and 94. The single rectifier would be operating as a full-wave rectifier to convert the bipolar signals (i.e., amplified signal or the inverted amplified signal) into a unipolar form (i.e., a signal having first positive portions of the amplified signal and second positive portions of the inverted amplified signal). However, since the single full-wave rectifier may not be able to rectify the negative portions of the bipolar signals at the higher frequencies, the use of two half-wave rectifiers is preferred.

The unity-gain adder 96 is coupled to the first and second rectifiers 92 and 94 to receive the first and second rectified signals. The unity-gain adder adds the two signals to generate an added signal.

The integrator 98 is coupled to the unity-gain adder 96 to receive the added signal to output a first output signal. The first output signal is indicative of the first output waveform area within the added signal over a predefined interval of 250 ns. Other intervals may also be used. The first output waveform area represents an absolute area of positive and negative portions within the comparison signal. The first output signal is transmitted from an output node 72 of the integrator to the correlator 75 of the IC tester 20 (FIGS. 1, 2 and 3) for subsequent analysis. The output node corresponds to the output terminal 34 of the integrator 98 in FIG. 14.

A second output signal indicative of a second output waveform area is also generated by the ten op-amp configuration from a different set of power transient signals. The second output signal is also transmitted to the correlator 75 of the IC tester 20 for analysis. As a further processing sequence, a cross-correlation is performed on a first value corresponding to the first output waveform area and a second value corresponding to the second output waveform area. In one embodiment, the first and second values are plotted to determine if the correlated value falls within the confidence level for determining the pass/fail status of the DUT.

Figure 16:
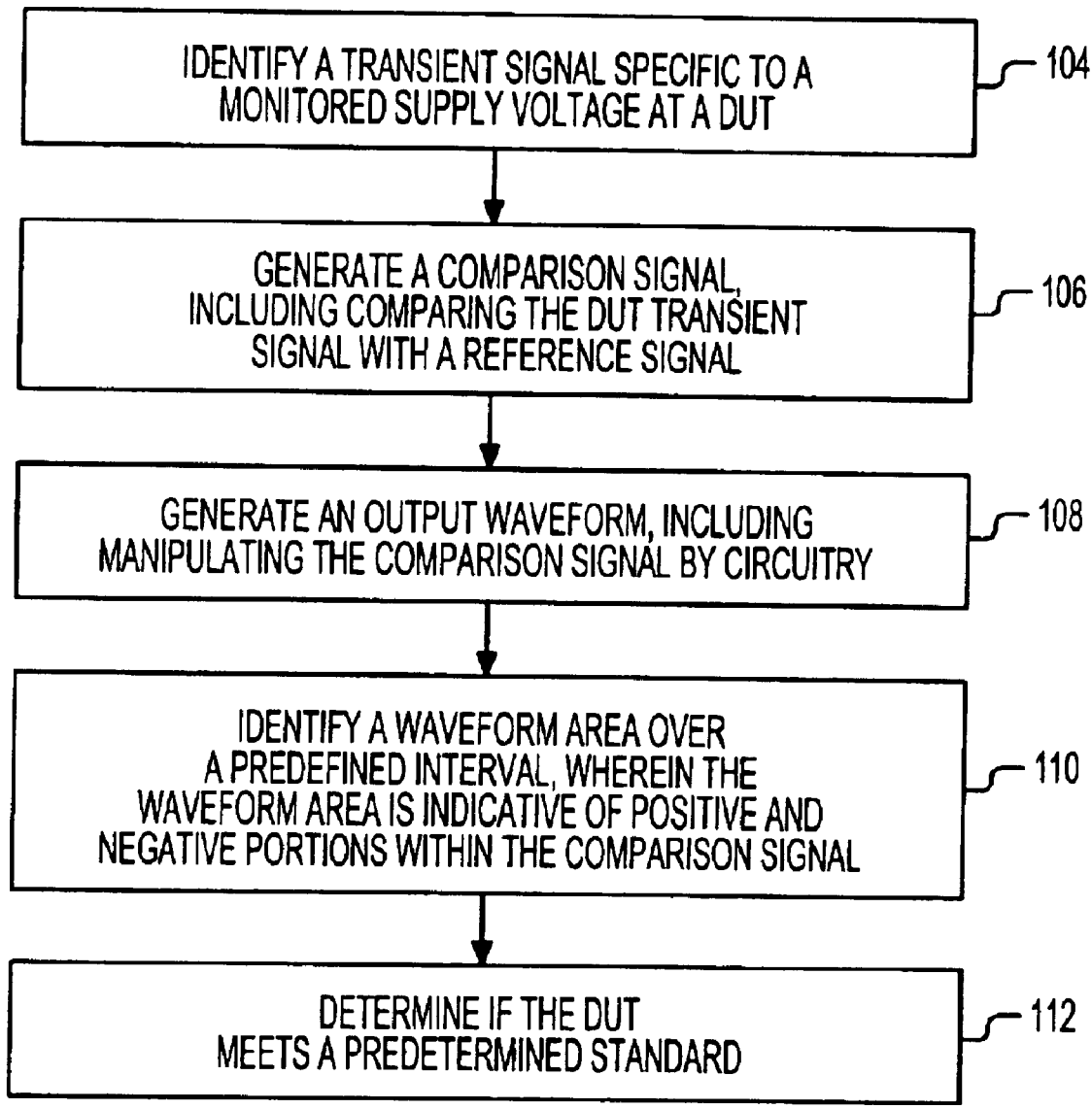
FIG. 16 is a process flow diagram for testing a DUT by transient signal analysis in accordance with the invention.

The method for testing a DUT by transient signal analysis is described with reference to the process flow diagram of FIG. 16. In step 104, a DUT transient signal specific to a monitored supply voltage at the DUT is identified. In step 106, a comparison signal is generated by comparing the DUT transient signal with a reference signal by the comparison circuit. In one embodiment, the step of comparing includes subtracting the DUT transient signal from the reference transient signal.

In step 108, an output waveform is generated by manipulating the comparison signal by circuitry. In one embodiment, the comparison circuit and the manipulation circuitry include seven op-amps. In another embodiment, the comparison circuit and the manipulation circuitry include ten op-amps.

In step 110, a waveform area within the output waveform is identified over a predefined interval. The first output waveform area is indicative of positive and negative portions within the comparison signal. A first value that corresponds to the first output waveform area over the predefined interval is plotted with a second value that corresponds to a second output waveform area over a corresponding interval. In step 112, the plotted X-Y coordinate that is defined by this pairing is examined to determine if it falls within a confidence level within a pass/fail standard.

What is claimed is:

1. A system for testing an integrated circuit (IC) by transient signal analysis comprising:
   a comparison circuit configured to generate a comparison signal from an IC transient signal and a reference signal, said IC transient signal being specific to a monitored supply voltage at said IC; and
   circuitry operationally coupled to said comparison circuit, said circuitry being configured to manipulate said comparison signal to generate an output waveform, said output waveform being indicative of changes made by said circuitry to said comparison signal for determining if said IC meets a predetermined standard, wherein said circuitry includes a unity-gain inverter in communication with said comparison circuit, said unity-gain inverter being configured to receive and invert said comparison signal.

2. The system of claim 1 wherein said comparison signal is representative of a difference between said IC transient signal and said reference signal.

3. The system of claim 1 wherein said comparison circuit and said circuitry include a plurality of operational-amplifiers.

4. The system of claim 1 wherein said circuitry includes a first rectifier and a second rectifier arranged in a parallel configuration, said first rectifier being in communication with said comparison circuit to receive said comparison signal and to output first portions of said comparison signal, said second rectifier being in communication with said comparison circuit to receive said comparison signal and to output second portions of said comparison signal.

5. The system of claim 4 wherein said circuitry includes a unity-gain adder in communication with said first rectifier and said second rectifier, said unity-gain adder being configured to receive and add said first and second portions of said comparison signal.

6. The system of claim 5 further comprising an integrator in communication with said unity-gain adder, said integrator being configured to identify an output waveform area of said first and second portions of said comparison signal, said output waveform area being indicative of an absolute area of positive and negative portions within said output waveform.

7. The system of claim 6 wherein said unity-gain adder and said integrator are implemented as one operational amplifier.

8. The system of claim 6 further comprising an amplifier in direct communication with said comparison circuit, said amplifier being configured to receive and amplify said comparison signal to provide an auxiliary gain to distinguish variations within said comparison signal.

9. The system of claim 8 wherein said amplifier is an inverting amplifier, said inverting amplifier being configured to invert and amplify said comparison signal.

10. The system of claim 1 wherein said circuitry is configured to generate a second output waveform area from a second comparison signal, said second output waveform area having an absolute area of positive and negative portions within a second output waveform of said second comparison signal, said second comparison signal being generated from a second IC transient signal and a second reference signal.

11. A system for determining a pass/fail status of a device under test (DUT) by transient signal analysis comprising:
    a source for providing a supply voltage to a power supply terminal of said DUT;
    a comparison circuit operationally coupled to said power supply terminal, said comparison circuit being enabled to generate a comparison signal from a DUT transient signal and a reference transient signal, said DUT transient signal being monitored at said power supply terminal of said DUT; and
    circuitry operationally coupled to said comparison circuit, said circuitry being enabled to identify sampling portions of said comparison signal, said sampling portions being indicative of said pass/fall status of said DUT, said circuitry including an inverting amplifier, said inverting amplifier being enabled to invert and amplify said comparison signal to generate an inverted amplified signal.

12. The system of claim 11 wherein said circuitry includes a unity-gain inverter operationally coupled to said inverting amplifier, said unity-gain inverter being enabled to invert said inverted amplified signal to generate a twice-inverted amplified signal.

13. The system of claim 12 wherein said circuitry includes a first rectifier and a second rectifier arranged in parallel, said first rectifier being enabled to receive said inverted amplified signal from said inverting amplifier and output first portions of said inverted amplified signal, said second rectifier being enabled to receive said twice-inverted amplified signal from said unity-gain inverter and output second portions of said twice-inverted amplified signal.

14. The system of claim 13 wherein said circuitry includes an adder-Integrator circuit operationally coupled to said first rectifier and said second rectifier for respectively receiving said first portions of said inverted amplified signal and said second portions of said twice-inverted amplified signal, said adder-integrator circuit being enabled to add and compute an output waveform area of said first and second portions, said output waveform area being indicative of said sampling portions of said comparison signal.

15. The system of claim 13 wherein said first end second portions are positive portions of said inverted amplified signal and said twice-inverted amplified signal.

16. A method for testing an integrated circuit (IC) by transient signal analysis comprising the steps of:
    providing and IC transient signal specific to a monitored supply voltage to said IC;
    generating a comparison signal, including comparing said IC transient signal with a reference signal;

inverting said comparison signal by a unity-gain inverter generating an output waveform using said comparison signal after said comparison signal has been inverted, including manipulating said comparison signal by circuitry, said output waveform being indicative of changes made by said circuitry to said comparison signal; and determining if said IC meets a predetermined standard on a basis of said output waveform.

17. The method of claim 16 further comprising a step of identifying a waveform area over a predefined interval, said waveform area being indicative of an absolute area of positive and negative portions within said comparison signal.

18. The method of claim 16 further comprising a step of rectifying said comparison signal to provide first and second portions of said comparison signal.

19. The method of claim 18 further comprising a step of adding said first and second portions of said comparison signal.

20. The method of claim 19 further comprising a step of integrating said first and second portions of said comparison signal for identifying an absolute area within said comparison signal.

21. The method of claim 18 further comprising a step of amplifying said comparison signal to provide an auxiliary gain to distinguish variations within said comparison signal.

22. The method of claim 21 wherein amplifying said comparison signal further includes inverting said comparison signal.

23. A system for testing an integrated circuit (IC) by transient signal analysis comprising:

a comparison circuit configured to generate a comparison signal from an IC transient signal and a reference signal, said IC transient signal being specific to a monitored supply voltage at said IC;

circuitry operationally coupled to said comparison circuit, said circuitry being configured to manipulate said comparison signal to generate an output waveform, said output waveform being indicative of changes made by said circuitry to said comparison signal for determining if said IC meets a predetermined standard, wherein said circuitry is configured to generate a second output waveform area from a second comparison signal, said second output waveform area having an absolute area of positive and negative portions within a second output waveform of said second comparison signal, said second comparison signal being generated from a second IC transient signal and a second reference signal; and a correlator in communication with said circuitry, said correlator being configured to plot a first value corresponding to an output waveform area calculated for said output waveform over a predefined time interval with a second value corresponding to said second output waveform area over a corresponding time interval for determining if said IC meets said predetermined standard.

24. The system of claim 23 wherein said predetermined standard is a confidence level that is established by applying statistical analysis.

25. A system for testing an integrated circuit (IC) by transient signal analysis (TSA) comprising:

a comparison circuit configured to generate a comparison signal from an IC transient signal and a reference signal, said IC transient signal being an acquired waveform of a monitored IC supply voltage as a function of time during which logic transitions occur at said IC, said reference signal being a reference waveform of voltage as a function of time, said comparison circuit being enabled to generate said comparison signal as a comparison waveform that is a difference between said acquired waveform and said reference waveform; and circuitry operationally coupled to said comparison circuit, said circuitry being configured to manipulate said comparison signal to generate an output waveform, said output waveform being indicative of changes made by said circuitry to said comparison signal for determining if said IC meets a predetermined standard.

26. A method for testing an integrated circuit (IC) by transient signal analysis (TSA) comprising the steps of:

providing an IC transient signal specific to a monitored supply voltage to said IC, including acquiring said IC transient signal as an acquired waveform of said monitored supply voltage as a function of time during which logic transitions occur at said IC;

generating a comparison signal, including comparing said IC transient signal with a reference waveform of voltage as a function of time, said comparing including a waveform differencing procedure;

generating an output waveform, including manipulating said comparison signal by circuitry, said output waveform being indicative of changes made by said circuitry to said comparison signal; and determining if said IC meets a predetermined standard on a basis of said output waveform.

* * * * *

UNITED STATES PATENT AND TRADEMARK OFFICE
CERTIFICATE OF CORRECTION

PATENT NO.    : 6,759,864 B2  
DATED         : July 6, 2004  
INVENTOR(S)   : Chintan Patel Page 1 of 1

It is certified that error appears in the above-identified patent and that said Letters Patent is hereby corrected as shown below:

Column 11,
Line 34, please replace "said circultry being" with the phrase -- said circuitry being --.

Column 12,
Line 32, please replace "said pass/fall" with the phrase -- said pass/fail --.

Signed and Sealed this

First Day of February, 2005

JON W. DUDAS
*Director of the United States Patent and Trademark Office*